United States Patent
Cho

(10) Patent No.: US 6,331,963 B1
(45) Date of Patent: Dec. 18, 2001

(54) SEMICONDUCTOR MEMORY DEVICE AND LAYOUT METHOD THEREOF

(75) Inventor: Ho Yeol Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/612,072

(22) Filed: Jul. 7, 2000

(30) Foreign Application Priority Data

Oct. 11, 1999 (KR) .................................................. 99-43826

(51) Int. Cl.[7] .................................................. G11C 8/00
(52) U.S. Cl. .............................. 365/230.03; 365/230.01; 365/230.06
(58) Field of Search ..................... 365/230.01, 189.01, 365/230.03, 230.06, 230.08

(56) References Cited

U.S. PATENT DOCUMENTS

| | | | |
|---|---|---|---|
| 5,815,454 | * | 9/1998 | Tomishima et al. .................. 365/226 |
| 5,940,342 | * | 8/1999 | Yamazaki ........................ 365/230.03 |
| 5,966,340 | * | 10/1999 | Fujino et al. ................... 365/230.03 |
| 5,973,983 | * | 10/1999 | Hidaka ............................ 365/230.03 |
| 6,028,810 | * | 2/2000 | Ooishi ............................. 365/230.03 |
| 6,147,925 | * | 11/2000 | Tomishima et al. ............. 365/230.03 |
| 6,175,532 | * | 1/2001 | Ooishi ............................. 365/230.03 |
| 6,198,682 | * | 3/2001 | Proebsting ......................... 365/207 |
| 6,208,575 | * | 3/2001 | Proebsting ......................... 365/208 |

\* cited by examiner

Primary Examiner—Viet Q. Nguyen
(74) Attorney, Agent, or Firm—Mills & Onello, LLP

(57) ABSTRACT

The present invention discloses a semiconductor memory device. The device comprises a predetermined number of groups of a plurality of memory cell array blocks and a plurality of column decoders. The groups of the plurality of memory cell array blocks are connected to a predetermined number of column select signal lines among a plurality of column select signal lines, respectively. Each of the memory cell array blocks includes a plurality of memory cells connected between a plurality of word lines arranged in the same direction with the column select signal lines and a plurality of bit line pairs. The plurality of column decoders select corresponding column select signal lines between the plurality of memory cell array blocks in response to corresponding block select signal for selecting each of the plurality of memory cell array blocks and corresponding column address. Corresponding column select signal lines between the plurality of memory cell array blocks are commonly connected to adjacent memory cell array blocks. Accordingly, the number of column select signal lines and I/O gates is not increased because of grouping identical memory cell array blocks even though the capacity of memory cell array blocks is enlarged in a row direction, and thereby a chip size is reduced.

2 Claims, 10 Drawing Sheets

SEMICONDUCTOR MEMORY DEVICE AND LAYOUT METHOD THEREOF

BACKGROUND OF THE INVENTION

1. Field of the Invention

The present invention relates to a semiconductor memory device and a layout method for a semiconductor memory device. More specifically, the present invention provides a semiconductor memory device and a layout method for arranging a semiconductor memory device without increasing chip size while increasing memory capacity.

2. Description of the Related Art

In a conventional layout method for arranging signal lines of memory cell arrays in a semiconductor memory device, word lines and I/O lines are disposed in the same direction with each other. Column select signal lines and bit lines are disposed in a row direction as intersecting the word lines. This general signal line layout method can integrate many memory cells.

However, in recent years, it has become necessary for a semiconductor memory device to include a number of data I/O lines that is more than the number of column select signal lines, in order to increase the number of bits transferred per second, in accordance with the development of graphic fields. Accordingly, a layout method for arranging signal lines different from the conventional layout method is used in the graphic fields. That is, in the layout method of the graphic fields, word lines and column select signal lines are disposed in the same direction with each other, and bit lines and I/O lines are disposed as intersecting the word lines.

FIG. 1 is a block diagram illustrating one type of a conventional semiconductor memory device. The device includes memory cell array blocks 10-1, 10-2, . . . , and 10-8, row decoders 12-1, 12-2, . . . , and 12-8, column decoders 14-1, 14-2, . . . , and 14-9, and column predecoder 16. Column select signal lines CSL0, CSL1, CSL2 and CSL3 are disposed in a row direction. I/O line pairs(IO1, IO1B), (IO2, IO2B), . . . , and (IOm, IOmB) are disposed in a column direction as intersecting the column select signal lines CSL0, CSL1, CSL2 and CSL3. The column select signal lines are commonly connected to two adjacent memory cell array blocks. For example, the column select signal lines CSL2 and CSL3 between the memory cell array blocks 10-1 and 10-2 select the memory cell array block 10-1 when the memory cell array block 10-1 is activated, or select the memory cell array block 10-2 when the memory cell array block 10-2 is activated.

Eight row decoders 12-1, 12-2, . . . , and 12-8 input and decode row address RA0-k of k bits, the row decoders 12 becoming active in response to block select signals BLS0, BLS1, . . . , and BLS7.

The column predecoder 16 generates decoding output signals CA0B1B, CA01B, CA0B1, and CA01 by decoding column address CA0 and CA1. Responding to the block select signal BLS0 at a high level, the column decoder 14-1 activates the column select signal line CSL0 when the decoding output signal CA0B1B is at a high level and activates the column select signal line CSL1 when the decoding output signal CA01B is at a high level. Responding to the block select signal BLS7 at a high level, the column decoder 14-9 activates the column select signal line CSL0 when the decoding output signal CA0B1B is at a high level or activates the column select signal line CSL1 when the decoding output signal CA01B is at a high level. Responding to the block select signal BLS0 or BLS1 at a high level, the column decoder 14-2 activates the column select signal line CSL2 when the decoding output signal CA0B1 is at a high level or activates the column select signal line CSL3 when the decoding output signal CA01 is at a high level. The column decoders 14-3, . . . , and 14-8 activate the column select signal lines CSL0, CSL1, CSL2 and CSL3 with the same method as the column decoder 14-1 or 14-2.

FIG. 2 is a circuit diagram illustrating one configuration of the column predecoder 16 of FIG. 1. The column predecoder 16 includes inverters I1, I2, I3, I4, I5 and I6, and NAND gates NA1, NA2, NA3 and NA4. The inverters I1 and I2 invert the column address CA0 and CA1, respectively. The circuit including NAND gate NA1 and inverter I3 generates the decoding output signal CA0B1B at a high level when inputting output signals of the inverters I1 and I2 at a high level. The circuit including NAND gate NA2 and inverter I4 generates the decoding output signal CA01B at a high level when inputting output signals of the column address CA0 and inverter I2 at a high level. The circuit including NAND gate NA3 and inverter I5 generates the decoding output signal CA0B1 at a high level when inputting an output signal of the inverter I1 and the column address CA1 at a high level. The circuit including NAND gate NA4 and inverter I6 generate the decoding output signal CA01 by inputting the column addresses CA0 and CA1 at a high level.

FIG. 3 is a circuit diagram illustrating one configuration of one of the column decoders 14 of FIG. 1. The column decoders 14 each include a NOR gate NOR1, inverters I7, I8 and I9, and NAND gates NA5 and NA6. In FIG. 3, signals C1 and C2 denote two block control signals applied to each of the column decoders 14-1, 14-2, . . . , and 14-9 of FIG. 1. Signals I1 and I2 denote two decoding output signals (CA0B1B, CA01B) and (CAOB1, CA01), respectively, applied to each of the column decoders 14-1, 14-2, and 14-9 of FIG. 1. Signals O1 and O2 denote two column select signals output from each of the column decoders 14-1, 14-2, . . . , and 14-9 of FIG. 1.

Operation of the circuit illustrated in FIG. 3 will now be described. The circuit including NOR gate NOR1 and inverter I7 generates an output signal at a high level in the case in which at least one signal of signals C1 and C2 is at a high level. The circuit including NAND gate NA5 and inverter I8 outputs the input signal I1 as the output signal O1 by responding to an output signal of the inverter I7 at a high level. The circuit including NAND gate NA6 and inverter I9 outputs the input signal I2 as the output signal O2 by responding to an output signal of the inverter I7 at a high level.

FIG. 4 is a detailed block diagram illustrating one configuration of the memory cell array block 10-2 of FIG. 1. The memory cell array block includes memory cells 20-11, 20-12, . . . , 20-1(4m), 20-21, 20-22, 20-2(4m), . . . , 20-n1, 20-n2, . . . , and 20-n(4m), precharge circuits 22-1, 22-2, . . . , and 22-(4m), sense amplifiers 24-1, 24-2, . . . , and 24-(4m), and I/O gates IOG1, IOG2, and IOG(4m).

Word lines WL1, WL2, . . . , and WLn of the memory cell array block 10-2 are disposed in the same direction as the column select signal lines CSL0, CSL1, CSL2 and CSL3. Bit line pairs (BL1, BL1B), (BL2, BL2B), . . . , and (BL(4m), BL(4m)B) are disposed in the same direction as I/O line pairs (IO1, IO1B), . . . , and (IOm, IOmB).

Also, the memory cells 20-11, 20-12, . . . , 20-1(4m), 20-21, 20-22, . . . , 20-2(4m), . . . , 20-n1, 20-n2, . . . , and 20-n(4m) are connected between the word lines WL1, WL2, ..., and WLn and bit line pairs (BL1, BL1B), (BL2, BL2B), ..., and (BL(4m), BL(4m)B), respectively. The I/O gate IOG1, I/O gates IOG5(not shown), ..., and IOG(4m-3) are connected to the column select signal line CSL0. The I/O gate IOG3, I/O gates IOG7(not shown), ..., and I/O gate IOG(4m-1) are connected to the column select signal line CSL1. The I/O gate IOG4, I/O gates IOG8(not shown), ..., and I/O gate IOG(4m) are connected to the column select line CSL2. The I/O gate IOG2, I/O gates IOG6(not shown), ..., and IOG(4m-2) are connected to the column select signal line CSL3.

Data I/O operation of the circuit illustrated in FIG. 4 will now be described. In the case of writing data into the memory cells 20-12, 20-14, ..., and 20-1(4m), when the write command is applied to the device, the precharge circuits 22-1, 22-2, ..., and 22-(4m) operate to precharge the bit line pairs (BL1, BL1B), (BL2, BL2B), ..., and (BL(4m), BL(4m)B), respectively. The word line WL1 is enabled and the column select signal line CSL2 is selected and the I/O gate IOG4, I/O gates IOG8(not shown), ..., and the I/O gate IOG(4m) are turned on. Data transferred through data I/O line pairs (IO1, IO1B), ..., and (IOm, IOmB) are transferred to the sense amplifiers 24-4, ..., and 24-(4m), respectively. The sense amplifiers 24-4, ..., and 24-(4m) amplify and transfer the data to the corresponding bit line pairs (BL4, BL4B), ..., and (BL(4m), BL(4m)B). The data transferred to the memory cells 20-14, ..., and 20-1(4m) is written.

In the case of reading data from the memory cells 20-14, ..., and 20-1(4m), when the read command is applied to the device, the precharge circuits 22-1, 22-2, ..., and 22-(4m) operate to precharge the bit line pairs (BL1, BL1B), (BL2, BL2B), ..., and (BL(4m), BL(4m)B), respectively. The word line WL1 is enabled and the column select signal line CSL2 is selected and the I/O gate IOG4, the I/O gates IOG8, (not shown), and the I/O gate IOG(4m) are turned on. The data stored in the memory cells 20-14, ..., and 20-1(4m) is transferred to the corresponding bit line pairs (BL4, BL4B), ..., and (BL(4m), BL(4m)B). The sense amplifiers 24-4, ..., and 24-(2m) amplify the data transferred to the bit line pairs (BL4, BL4B), ..., and (BL(4m), BL(4m)B) and then transfer the data to the data I/O line pairs (IO1, IO1B), ..., and (IOm, IOmB).

The conventional semiconductor memory device as illustrated in FIG. 1 requires a large chip size due to the large number of column select signal lines, if the memory cell array block becomes larger in the row direction. If the size of the memory cell array blocks 10-1, 10-2, 10-3, and 10-4 illustrated in FIG. 1 are enlarged two times in a row direction and the number of the column select signal lines CSL0, CSL1, CSL2 and CSL3 is increased two times, a semiconductor memory device is constructed as illustrated in FIG. 5 according to a conventional layout method.

FIG. 5 a block diagram illustrating another configuration of a conventional semiconductor memory device. The device of FIG. 5 includes memory cell array blocks 30-1, 30-2, 30-3 and 30-4, row decoders 32-1, 32-2, 32-3 and 32-4, column decoders 34-1, 34-2, 34-3, 34-4 and 34-5, and column predecoders 36 and 38.

In FIG. 5, the size of the memory cell array blocks 30-1, 30-2, 30-3 and 30-4 is two times larger than that of FIG. 1, and the number of the column select signal lines CSL0, CSL1, ..., and CSL7 is increased two times more than that of FIG. 1. The memory cell array blocks are enlarged by two times in a row direction, so that the number of the column select signal lines is increased by two times.

FIG. 6 is a circuit diagram illustrating one configuration of the column predecoder 36, 38 of FIG. 5, comprising inverters I10, I11, I12, I13 and I14. The three inverters I10, I11 and I12 connected in series generate a decoding output signal CA2B by buffering and inverting a column address CA2. The two inverters I13 and I14 connected in series generate a decoding output signal CA2 by buffering and inverting the column address CA2.

FIG. 7 is a circuit diagram illustrating one configuration of the column decoder 34 of FIG. 5. Each column decoder 34 includes a NOR gate NOR2, NAND gates NA10, NA11, NA12 and NA13 and inverters I15, I16, I17, I18 and I19.

Referring to FIG. 7, control signals C1 and C2 denote two block select signals applied to each of the column decoders 34-1, 34-2, ..., and 34-5. Input signals I1, I2, I3 and I4 denote four decoding output signals CAOB1B, CAO1B, CAOB1 and CAB1 output from the column predecoder 36. An input signal I5 denotes one of two decoding output signals CA2B and CA2 output from the column predecoder 36.

Operation of the circuit illustrated in FIG. 7 will now be described. The circuit including a NOR gate NOR2 and inverter I15 generates a signal at a high level when one control signal of two control signals C1 and C2 is at a high level by ORing the control signals C1 and C2. The circuit including a NAND gate NA10 and inverter I16 outputs the input signal I1 as an output signal O1 by responding to an output signal of the inverter I15 at a high level and the input signal I5. The circuit including a NAND gate NA11 and inverter I17 outputs the input signal I2 as an output signal O2 by responding to the output signal of the inverter I15 at a high level and the input signal I5. The circuit including a NAND gate NA12 and inverter I18, and the circuit including a NAND gate NA13 and inverter I19 output the input signals I3 and I4 as output signals O3 and O4, respectively, by responding to the output signal of the inverter I15 at a high level and the input signal I5, respectively.

FIG. 8 is a detailed block diagram illustrating the cell array block 30-2 of FIG. 5. 8m memory cells MC are connected to word lines WL1, WL2,, and WLn. Four column select signal lines CSL0, CSL1, CSL2 and CSL3 are disposed at the lower portion of the memory cell array block 30-2. The remaining four column select signal lines CSL4, CSL5, CSL6 and CSL7 are disposed at the upper portion of the memory cell array block 30-2. And the eight column select signal lines CSL0, CSL1, ..., and CSL7 are connected to I/O gates IOG1, IOG2, ..., and IOG8, respectively.

FIG. 8 illustrates the connection among the memory cells, I/O gates and column select signal lines of memory cell array block 30-2 shown in FIG. 5, showing that the number of the I/O gates and column select signal lines is increased as two times since the capacity of the memory cells is enlarged as two times in a row direction. That is, in case of arranging the semiconductor memory device by the conventional layout method, the capacity of the memory array blocks is enlarged as two times in a row direction, and then the number of the I/O gates and column select signal lines is increased as two times. Accordingly, chip size is enlarged. Also, the line loading of the column select lines is increased since the column select lines become longer according to the increasing capacity of the memory cell array blocks.

SUMMARY OF THE INVENTION

One object of the present invention is to provide a semiconductor memory device which prevents an increase in chip size by not increasing the number of column select signal lines disposed between memory cell array blocks regardless of the increasing capacity of memory cell array blocks.

Another object of the present invention is to provide a layout method for arranging a semiconductor memory device in order to achieve the above object.

A semiconductor memory device in accordance with the invention includes a predetermined number of groups of a plurality of memory cell array blocks and a plurality of column decoders. The groups of the plurality of memory cell array blocks are connected to a predetermined number of column select signal lines among a plurality of column select signal lines, respectively. Each of the memory cell array blocks includes a plurality of memory cells connected between a plurality of word lines arranged in the same direction with the column select signal lines and a plurality of bit line pairs. The plurality of column decoders select corresponding column select signal lines between the plurality of memory cell array blocks in response to corresponding block select signal for selecting each of the plurality of memory cell array blocks and corresponding column address. Corresponding column select signal lines between the plurality of memory cell array blocks are commonly connected to adjacent memory cell array blocks.

To accomplish another object of the present invention, the semiconductor memory device includes a plurality of memory cell array blocks in which a plurality of word lines and a plurality of column select signal lines are arranged in the same direction with each other, and a plurality of I/O line pairs and a plurality of bit line pairs are arranged as intersecting the word lines. A layout method of the semiconductor memory device comprises steps of:

grouping the plurality of memory cell array blocks to be connected to a predetermined number of column select signal lines among the plurality of column select signal lines, and disposing the groups of memory cell array blocks in a top and bottom; and disposing the predetermined number of column select signal lines to be commonly connected to the plurality of memory cell array blocks in response to corresponding block select signals and corresponding column address.
The predetermined number of column select signal lines are disposed between the plurality of memory cell array blocks.

Further objects and advantages of the invention can be more fully understood from the following detailed description taken in conjunction with the accompanying drawings.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS OF THE INVENTION

Figure 9:
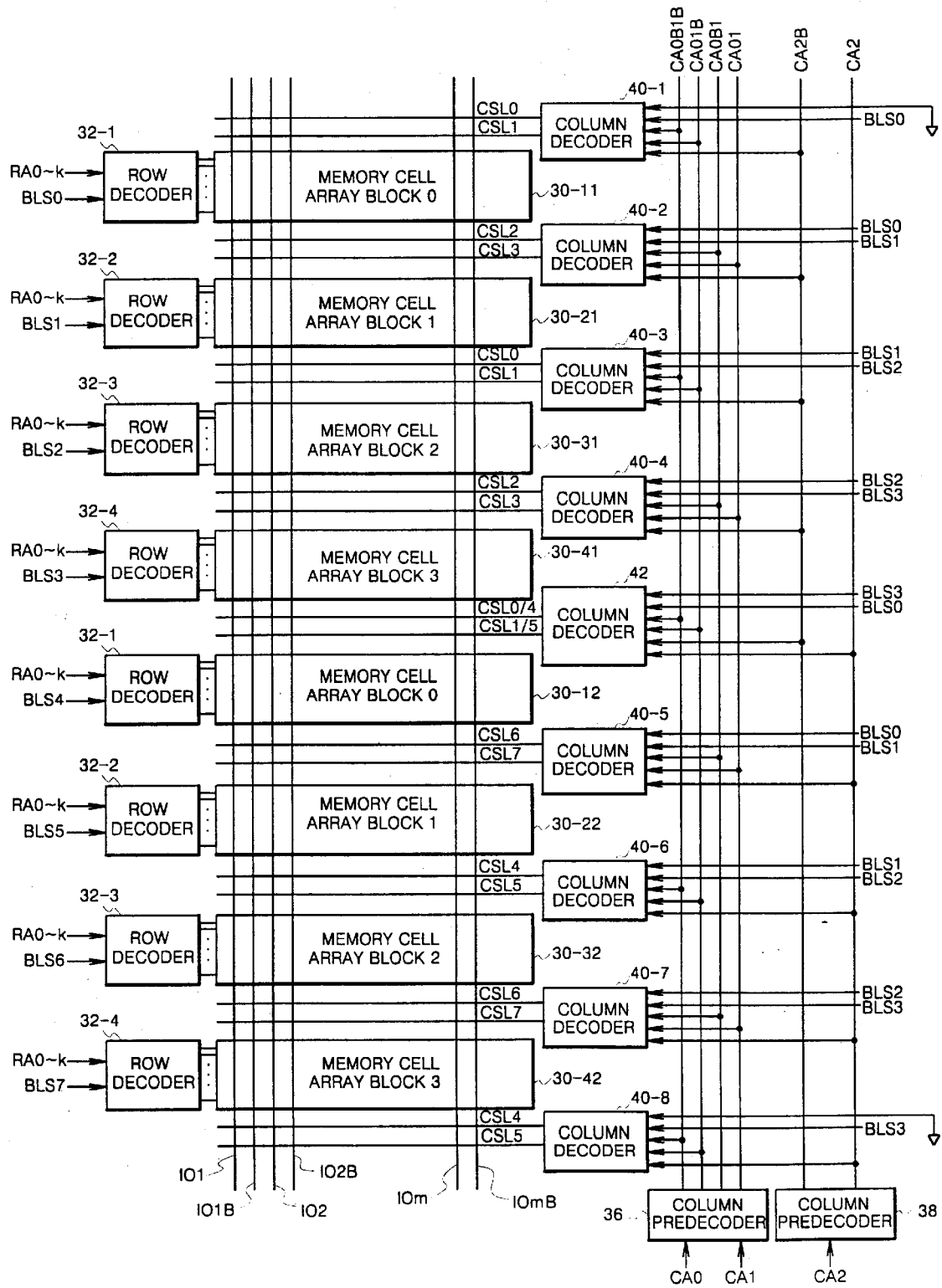
FIG. 9 is a block diagram illustrating one embodiment of a semiconductor memory device according to the present invention.

FIG. 9 is a block diagram illustrating an embodiment of a semiconductor memory device according to the present invention. In contrast to the structure of FIG. 5, in the structure of the embodiments of the invention shown in FIG. 9, memory cell array blocks 30-11, 30-21, 30-31 and 30-41 are disposed as shown connected to column select signal lines CSL0, CSL1, CSL2 and CSL3 in an upper portion of the device. Memory cell array blocks 30-12, 30-22, 30-32 and 30-42 are disposed as shown connected to column select signal lines CSL4, CSL5, CSL6 and CSL7 in a lower portion of the device. Also, two column select signal lines are disposed between pairs of the memory cell array blocks 30.

Column decoders 40-1, 40-2, 40-3, . . . , 40-8 and 42 for selecting two column select signal lines commonly connected between the memory cell array blocks activate the column select signal lines by using corresponding block select signal and column address signals predecoded differently from each other. That is, a conventional semiconductor memory device activates column select signal lines by using column address signals identically predecoded in response to block select signal, in order to select column select signal lines commonly connected between memory cell array blocks.

In FIG. 9, the memory cell array blocks are connected to row decoders 32-1, 32-2, 32-3 and 32-4. However, the identical memory cell array blocks are allowed to be commonly coupled to the identical row decoders.

Responding to a block select signal BLS0 and decoding output signal CA2B, and block select signal BLS3 and decoding output signal CA2, respectively, the column decoders 40-1 and 40-8 output decoding output signals CAOB1B and CAO1B to the column select signal lines CSL0 and CSL1, and output decoding output signals CAOB1 and CAO1 to the column select signal lines CSL4 and CSL5, respectively. Responding to the block select signal BLS0 or BLS1 and the decoding output signal CA2B, and the block select signal BLS0 or BLS1 and the decoding output signal CA2, respectively, the column decoders 40-2 and 40-5 output the decoding output signal CA0B1 to the column select signal lines CSL2 and CLS6, respectively, and output the decoding output signal CA01 to the column select signal lines CSL3 and CSL7, respectively. The column decoders 40-3 and 40-6 and the column decoders 40-4 and 40-7 perform the same operation in case that corresponding block select signals and decoding output signals are input thereto. The column decoder 42 outputs the decoding output signals CA0B1B and CA01B to the column select signals CSL0 and CSL1, respectively, in response to the block select signal BLS3 or BLS0 and the decoding output signal CA2B. The column decoder 42 outputs the decoding output signals CA0B1B and CA01B to the column select signal lines CSL4 and CSL5, respectively, in response to the block select signals BLS3 or BLS0 and the decoding output signal CA2.

Figure 5:
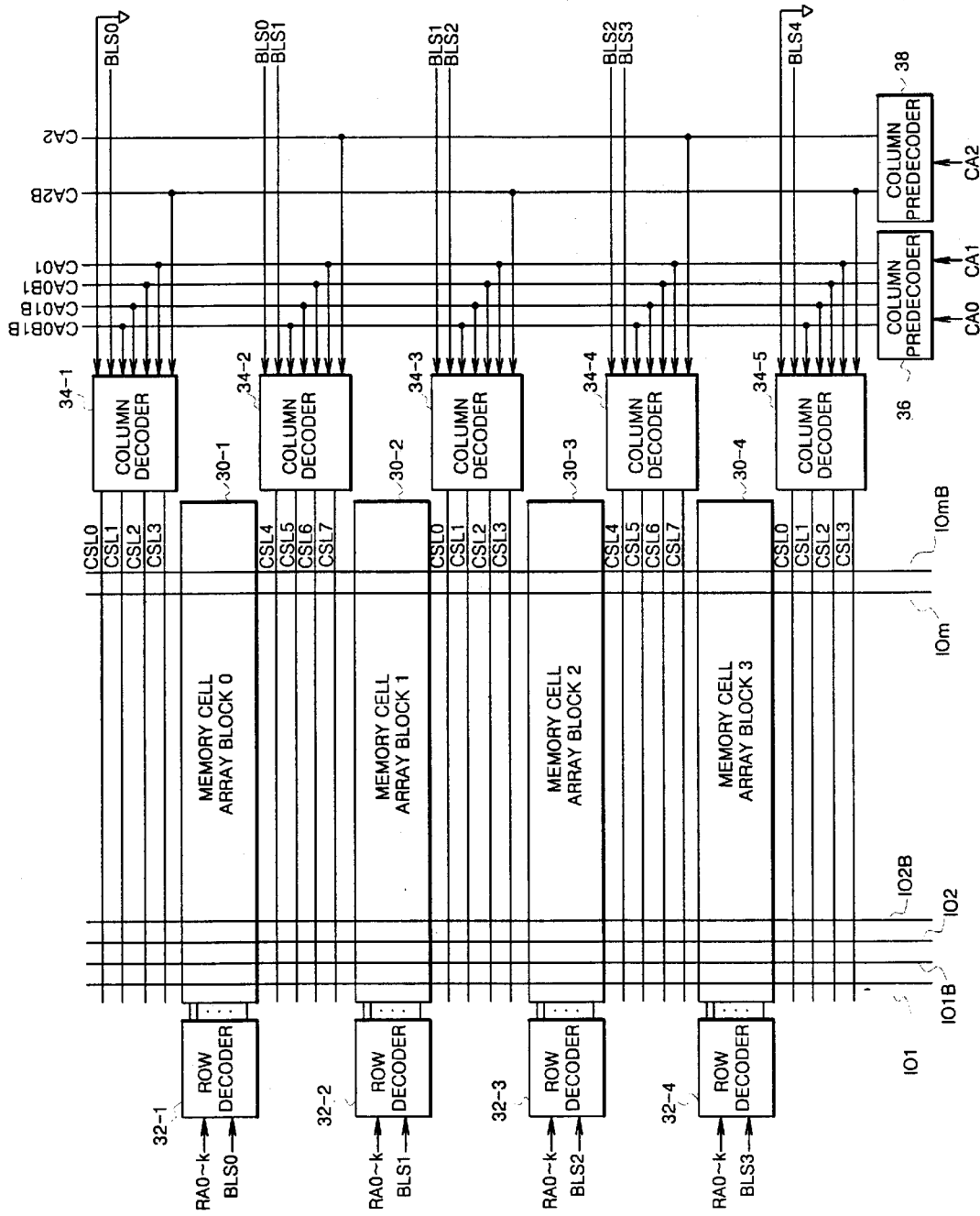
FIG. 5 a block diagram illustrating another configuration of a conventional semiconductor memory device.
Figure 6:
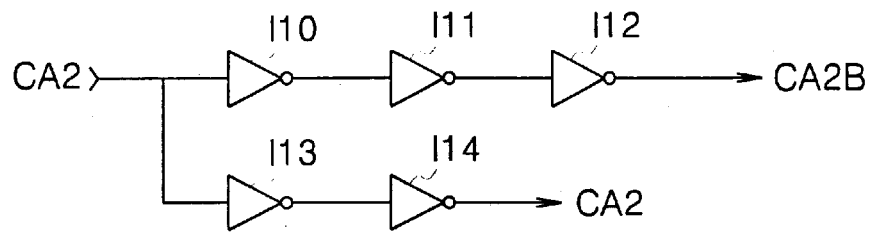
FIG. 6 a circuit diagram illustrating a configuration of a column predecoder of FIG. 5.
Figure 7:
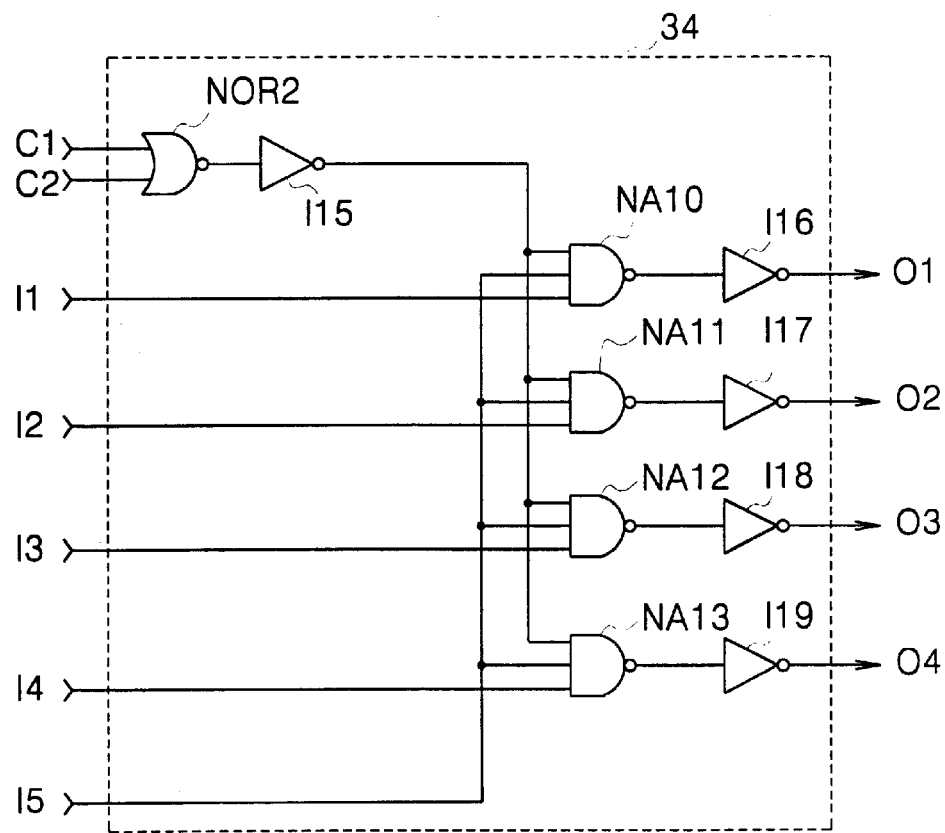
FIG. 7 a circuit diagram illustrating a configuration of a column decoder of FIG. 5.

As illustrated in FIG. 9, the number of column select signal lines is less than that of the structure of FIG. 5. That is, FIG. 5 includes twenty column select signal lines, but FIG. 9 includes just eighteen column select signal lines.

Figure 1:
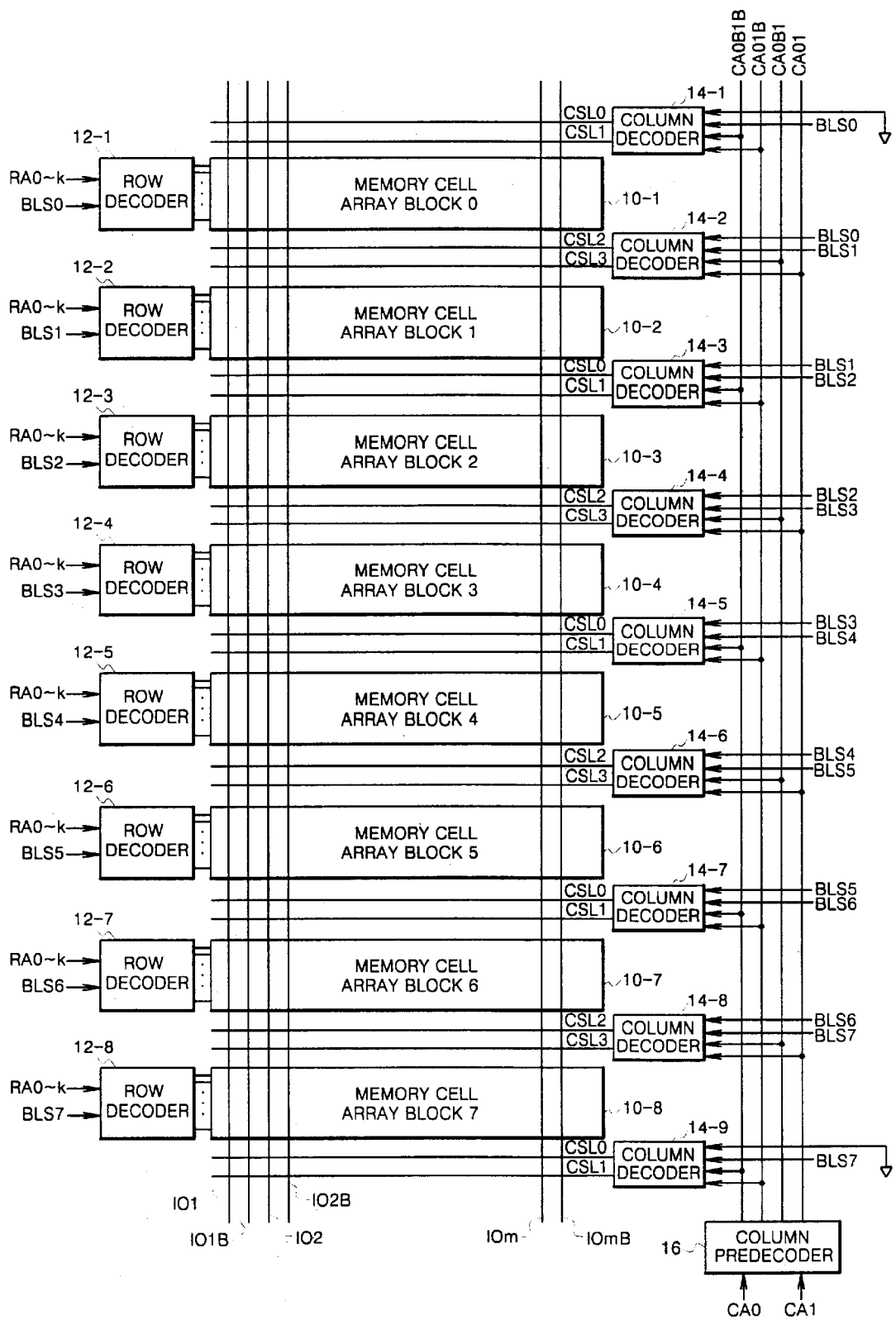
FIG. 1 is a block diagram illustrating a configuration of a conventional semiconductor memory device.
Figure 2:
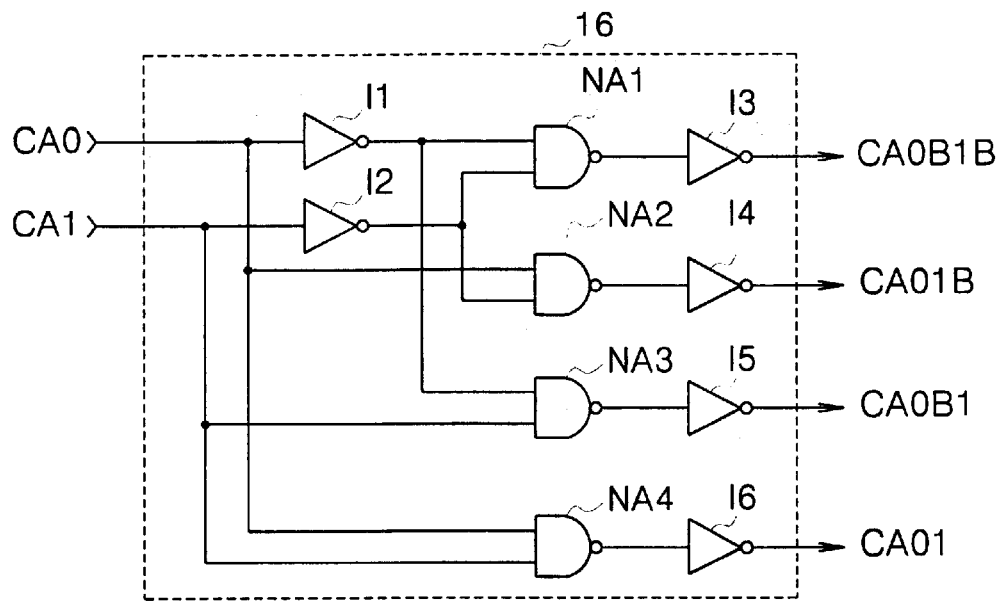
FIG. 2 is a circuit diagram illustrating a configuration of a column predecoder of FIG. 1.
Figure 3:
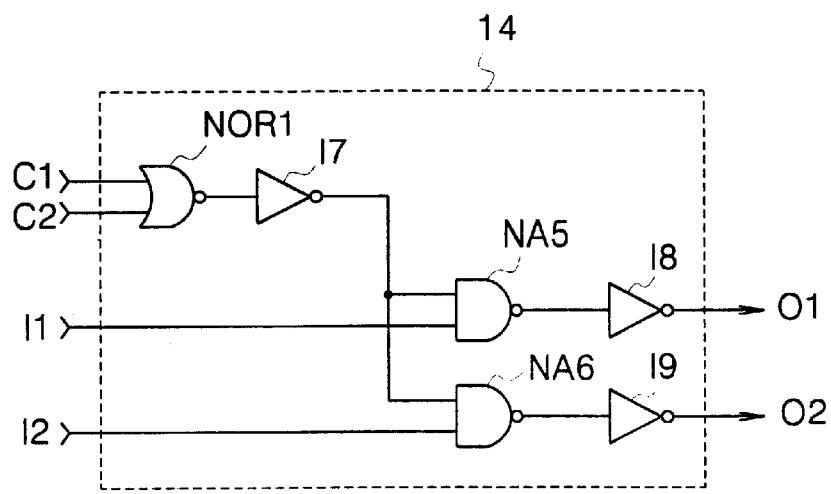
FIG. 3 is a circuit diagram illustrating a configuration of a column decoder of FIG. 1.
Figure 4:
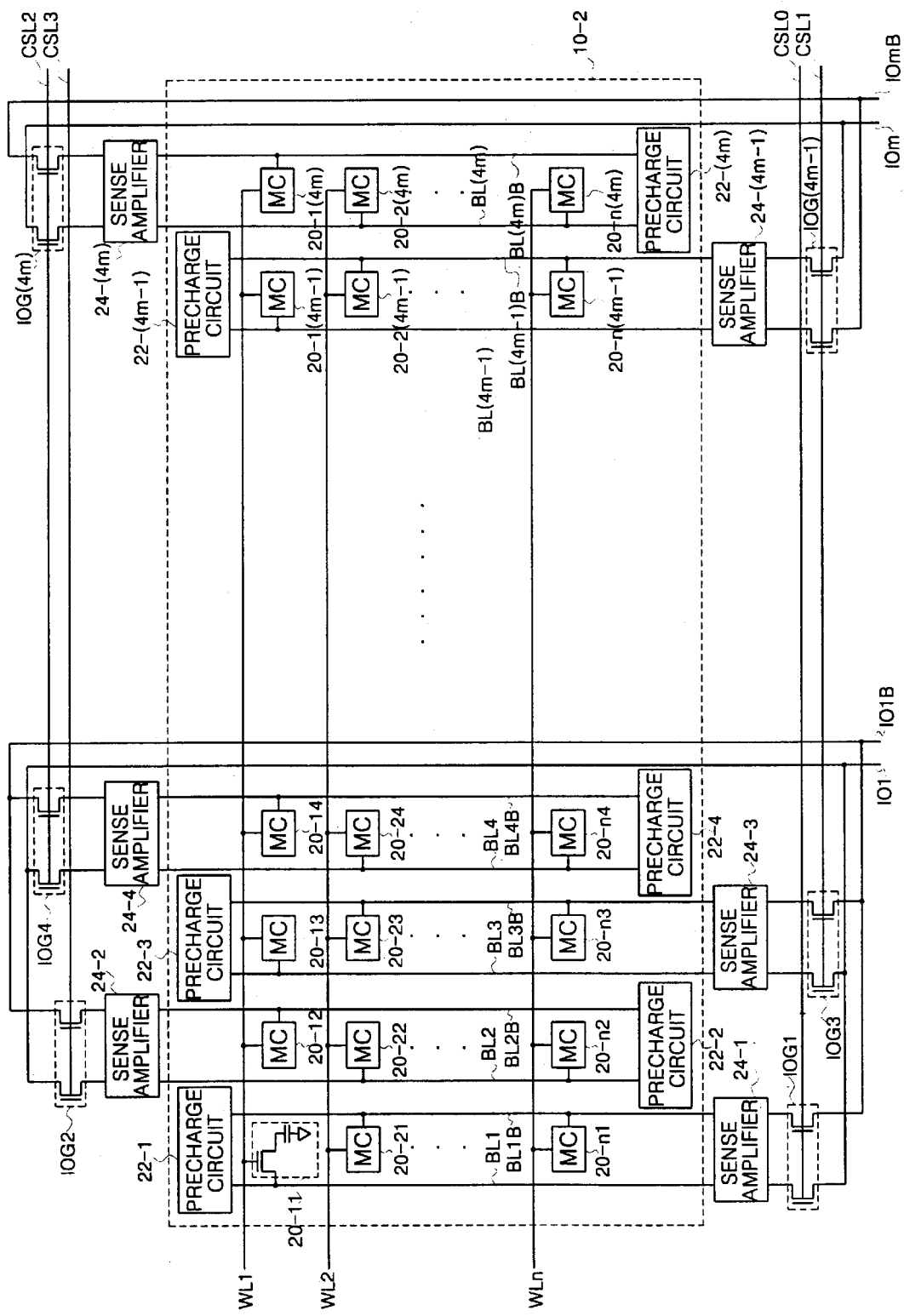
FIG. 4 is a detailed block diagram illustrating a configuration of a memory cell array block of FIG. 1.

Also, the memory cell array blocks of FIG. 9 are half the size of those of FIG. 5. Accordingly, the column select signal lines are kept to have the same length as the column select signal lines of FIG. 1 so that the line loading of the column select signal lines is not increased.

Figure 10:
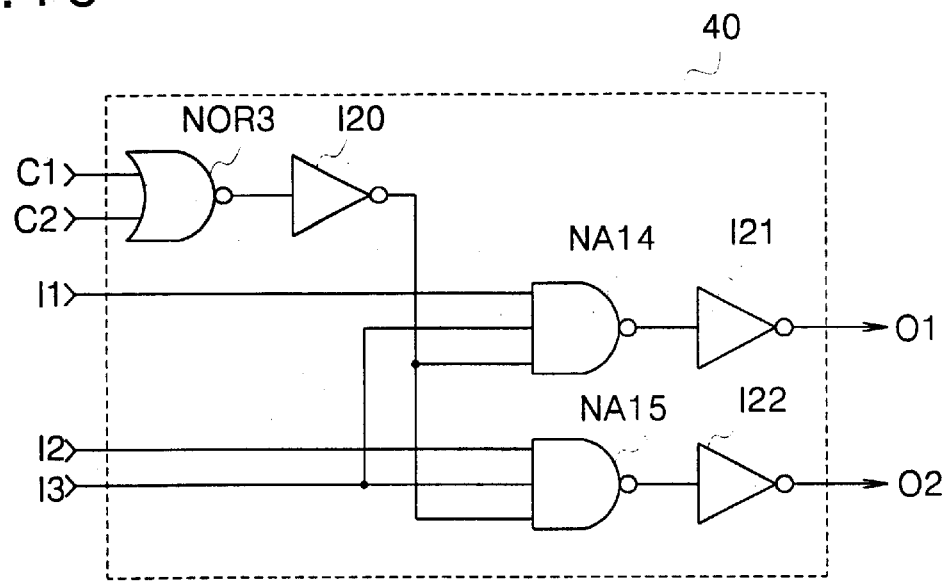
FIG. 10. is a circuit diagram illustrating an embodiment of a column decoder of FIG. 9.

FIG. 10 is a circuit diagram illustrating an embodiment of the column decoder of FIG. 9, comprising a NOR gate NOR3, NAND gates NA14 and NA15, and inverters I20, I21 and I22. In FIG. 10, the numeral 40 denotes each of the column decoders 40-1, 40-2, and 40-8 of FIG. 9.

Control signals C1 and C2 are two block select signals applied to each of the column decoders 34-1, 34-2, . . . , and 34-5. Input signals I1 and I2 are two pairs of the decoding output signals (CAOB1B, CAO1B) and (CAOB1, CAB1) output from the column predecoder 36. An input signal I3 is one of two decoding output signals CA2B and CA2 output from the column predecoder 36. Oeration of the circuit illustrated in FIG. 10 will now be described.

The circuit including the NOR gate NOR3 and inverter I20 generates a signal at a high level in case that one of two control signals Cl and C2 is at a high level. The circuit including the NAND gate NA14 and inverter I21 outputs the input signal I1 as an output signal O1 in response to an output signal of the inverter I20 at a high level and the input signal I3 at a high level. The circuit including the NAND gate NA15 and inverter I22 outputs the input signal I2 as an output signal O2 in response to an output signal of the inverter I20 at a high level and the input signal I2 at a high level.

That is, responding to one high level block select signal of two block select signals and one high level decoding output signal of two decoding output signals CA2B and CA2, each of the column decoders 40-1, 40-2, . . . , and 40-8 outputs the decoding output signals CA0B1B and CA01B to the column select signal lines in case that the decoding output signals CA0B1B and CA01B are inputted. In case that the decoding output signals CA0B1 and CA01 are inputted, the decoding output signals CAOB1 and CAO1 are outputted to the column select signal lines.

Figure 11:
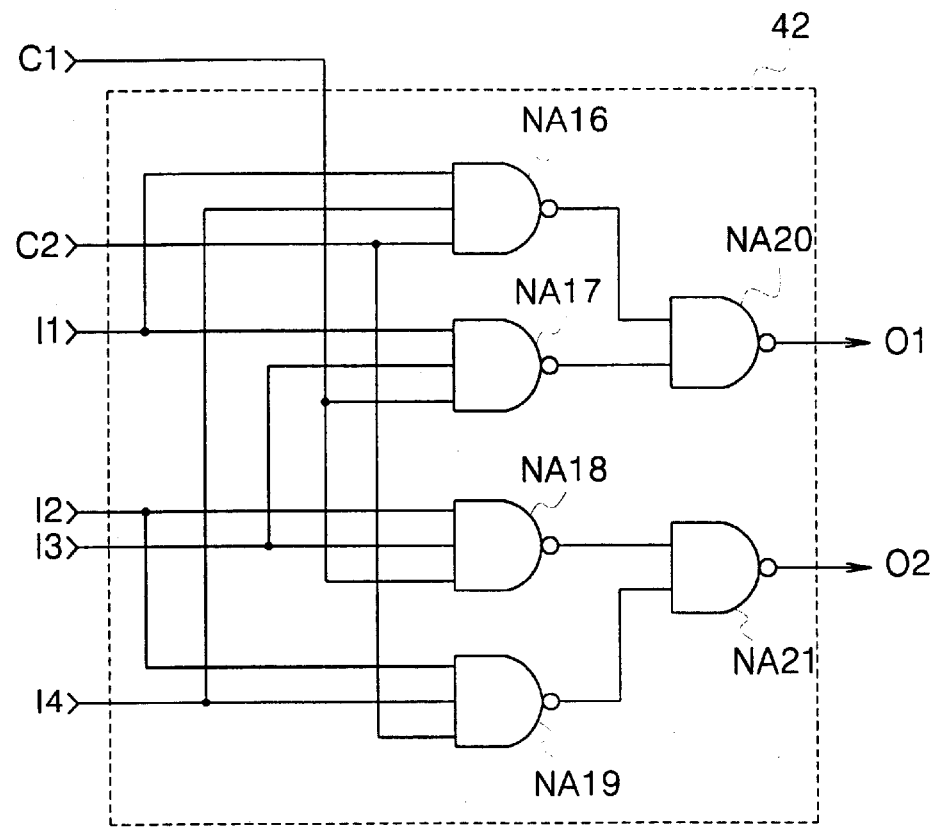
FIG. 11 is a circuit diagram illustrating an embodiment of another column decoder of FIG. 9.

FIG. 11 is a circuit diagram illustrating another embodiment of the column decoder of FIG. 9, comprising NAND gates NA16, NA17, NA19, NA20 and NA21. In FIG. 11, control signals C1 and C2 are two block select signals BLS3 and BLS0 applied to the column decoder 42. Input signals I1 and I2 are two decoding output signals CA0B1B and CA01B output from the column predecoder 36. Input signals I3 and I4 are two decoding output signals CA2B and CA2 output from the column predecoder 38.

An operation of the circuit illustrated in FIG. 11 will now be described. The NAND gate NA16 inverts and outputs the input signal I1 in response to the control signal C2 at a high level and the input signal I3. The NAND gate NA17 inverts and outputs the input signal I1 in response to the control signal C1 at a high level and the input signal I3. The NAND gate NA20 generates an output signal O1 by NANDing output signals of the NAND gates NA16 and NA17.

That is, the circuit including the NAND gates NA16, NA17 and NA20 outputs the decoding output signal CA0B1B as the output signal O1 in case that the block select signal BLS3 and the decoding output signal CA2B are at a high level. In case that the block select signal BLS3 and the decoding output signal CA2 are at a high level, the decoding output signal CA01B is output as the output signal O1.

The NAND gate NA18 inverts and outputs the input signal I2 in response to the control signal C1 at a high level and the input signal I3. The NAND gate NA19 inverts and outputs the input signal I2 in response to the control signal C2 at a high level and the input signal I4. The NAND gate NA21 generates an output signal O2 by NANDing output signals of the NAND gates NA18 and NA19.

That is, the NAND gates NA18, NA19 and NA21 output the decoding output signal CA0B1B as the output signal O2 in case that the block select signal BLS0 and the decoding output signal CA2B are at a high level. In case that the block select signal BLS0 and the decoding output signal CA2 are at a high level, the decoding output signal CA01B is outputted as the output signal O2.

Figure 12A:
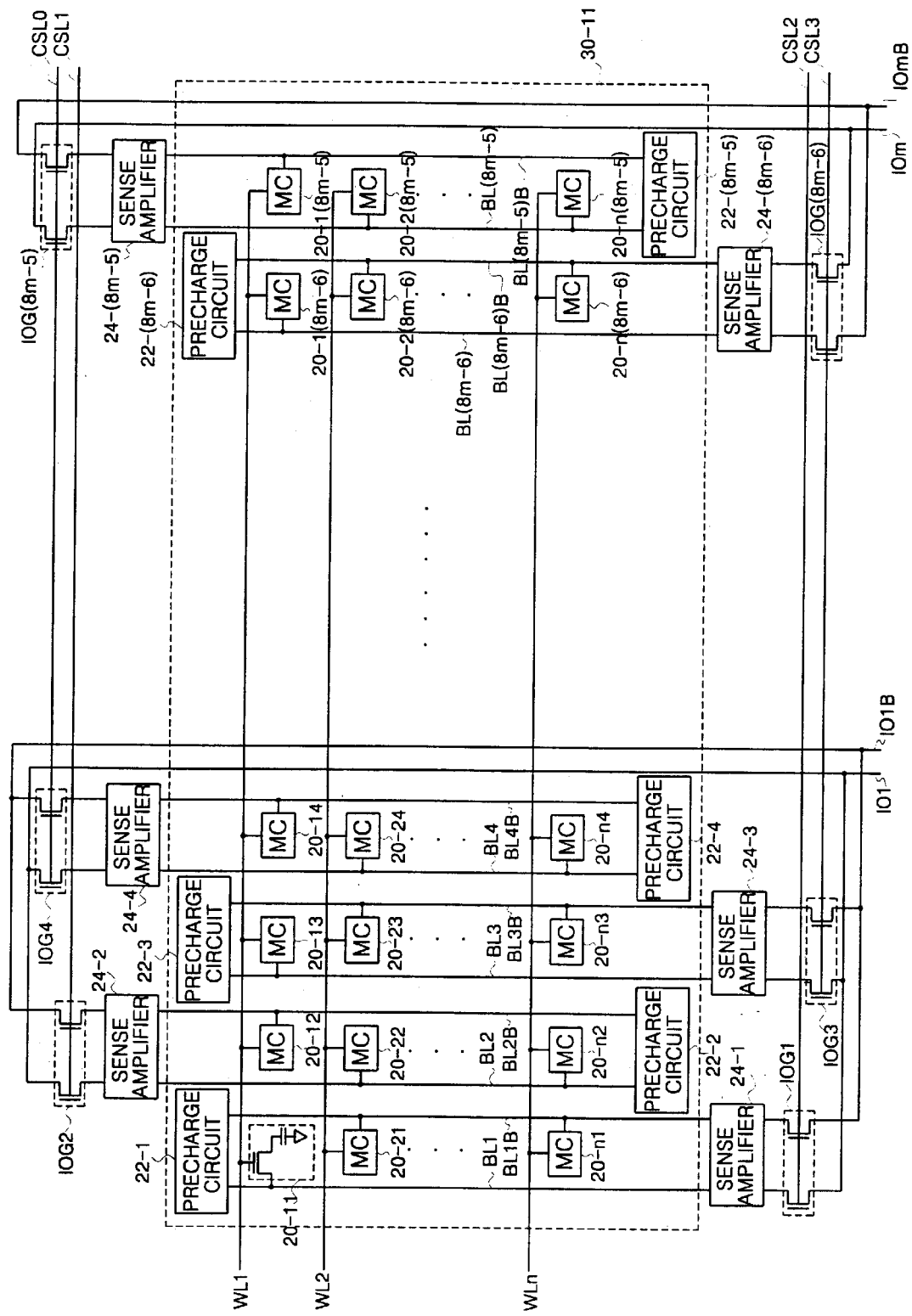
FIGS. 12a and 12b are schematic block diagrams illustrating an embodiment of memory cell array blocks of FIG. 9 according to the present invention.
Figure 12B:
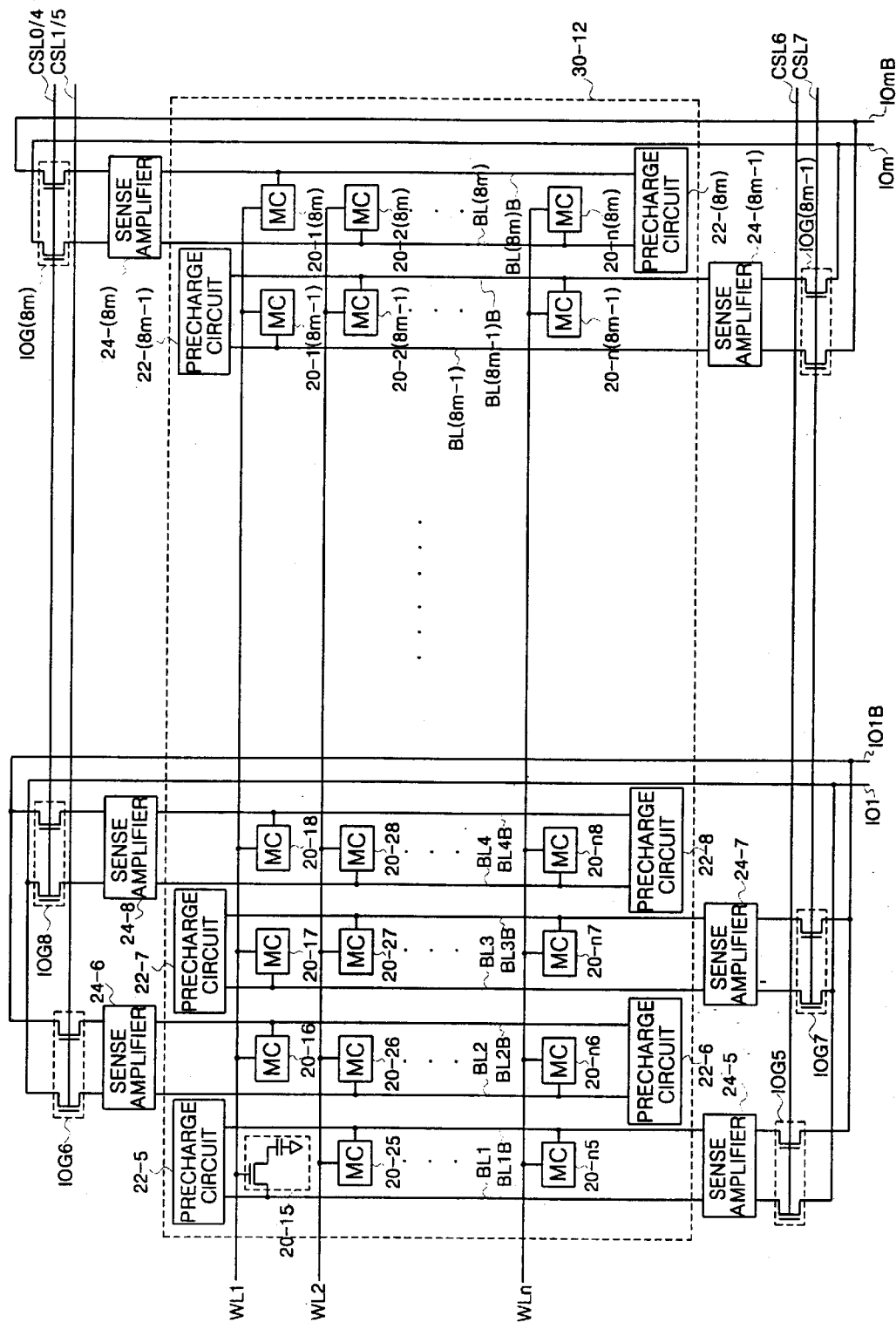

FIGS. 12a and 12b are detailed block diagrams illustrating an embodiment of memory cell array blocks 30-11 and 30-12 of the semiconductor memory device of FIG. 9 according to the present invention. Memory cell array block 30-11 includes memory cells MC connected to column select signal lines CSL0, CSL1, CSL2 and CSL3, and memory cell array block 30-12 includes memory cells MC connected to column select signal lines CSL0/4, CSL1/5, CSL6 and CSL7.

Figure 8:
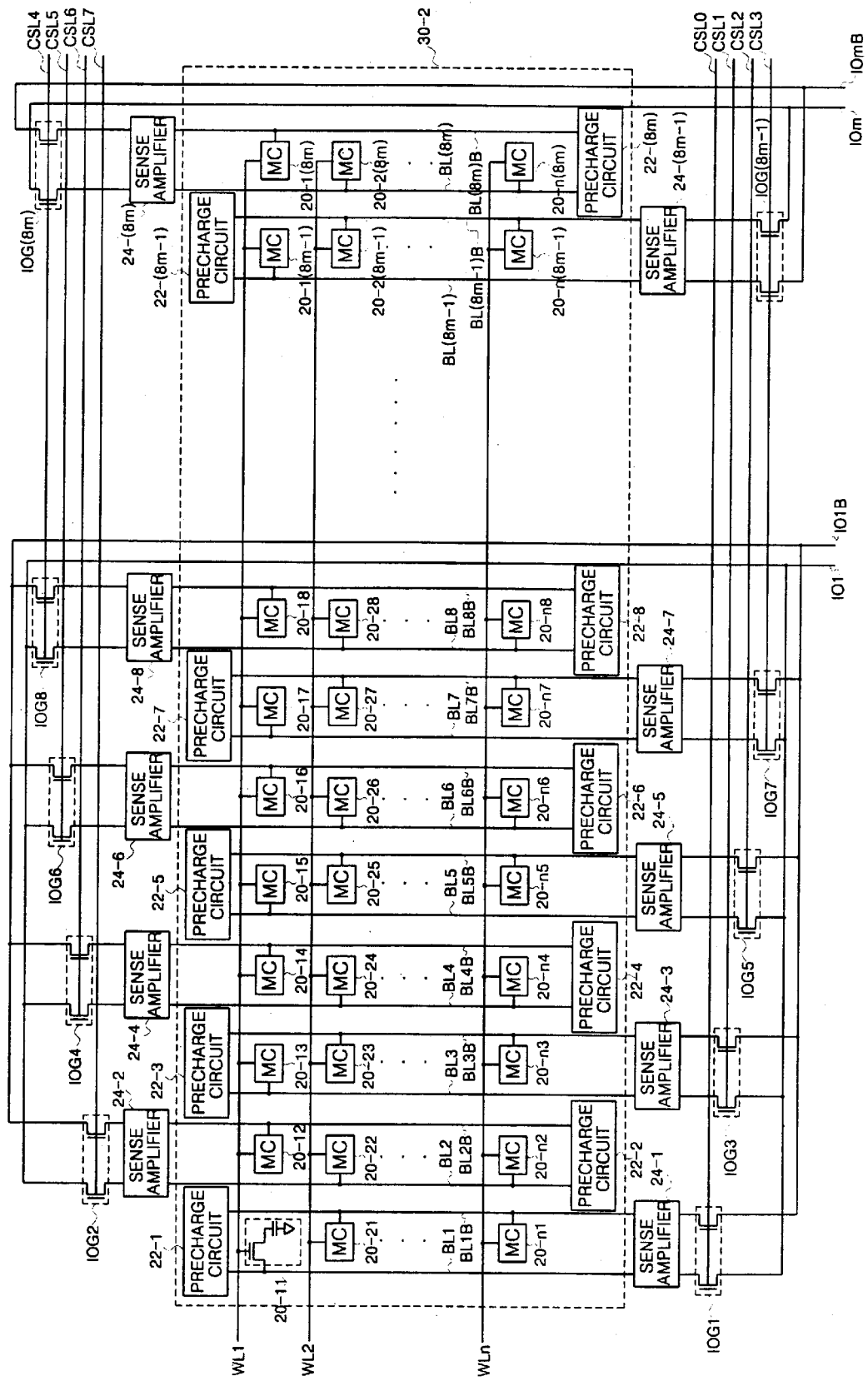
FIG. 8 is a detailed block diagram illustrating a configuration of a memory cell array block of FIG. 5.

Symbols and reference numerals of memory cell array blocks 30-11 and 30-12 of FIGS. 12a and 12b are indicated the same as those of memory cell array blocks 30-2 in FIG. 8.

As illustrated from memory cell array blocks 30-11 and 30-12 in FIGS. 12a and 12b, memory cell array blocks 30-11 and 30-12 are disposed at a top and a bottom side as dividing memory cell MC in memory cell array blocks and column select signal lines in halves in FIG. 8.

In the above-mentioned embodiments, although an effect of reducing a chip size is made without any noticeable result because a number of column select signal lines is not large, in case a number of column select signal lines is large, an effect of reducing a chip size is increased.

As shown above, a semiconductor memory device and a layout method thereof according to the present invention can reduce a chip size since the number of column select signal lines and I/O gates is not increased even though the capacity of memory cell array blocks is enlarged. In addition, the line loading of column select signal lines does not increase since the length of the column select signal lines does not increase even though the capacity of memory cell array blocks is enlarged.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A semiconductor memory device, comprising:
   a plurality of first memory cell array blocks connected to
      n/2 column select signal lines among n column select signal lines arranged in the same direction as word lines, including a plurality of memory cells connected between a plurality of the word lines and a plurality of bit line pairs;

a plurality of second memory cell array blocks connected to the remaining n/2 column select signal lines among said n column select signal lines, including identical memory cell array blocks to said plurality of first memory cell array blocks;

a plurality of first column decoders for generating (i) first decoding output signals for selecting the plurality of first memory cell array blocks and the plurality of second memory cell array blocks by decoding a first bit of a plurality of bits of a column address and (ii) second decoding output signals for selecting n/4 column select signal lines disposed at a top and a bottom side of each of the plurality of memory cell array blocks by decoding second bits except a first bit among the plurality of bits of a column address; and a plurality of second column decoders for selecting n/4 column select signal lines of corresponding memory cell array blocks in response to corresponding block select signals among a plurality of block select signals for selecting said plurality of first and second memory cell array blocks, and said first decoding and second output signals;

wherein said n/4 column select signal lines are commonly connected to adjacent memory cell array blocks.

2. The semiconductor memory device as claimed in claim 1, wherein each of said plurality of first column decoders generates said decoding output signals by predecoding a predetermined bit of a column address for selecting said n column select signal lines.

* * * * *